July 11, 1967 J. MOYSON ETAL 3,331,000

GATE TURN OFF SEMICONDUCTOR SWITCH HAVING A COMPOSITE GATE REGION WITH DIFFERENT IMPURITY CONCENTRATIONS

Filed Oct. 18, 1963 2 Sheets-Sheet 1

INVENTORS:
JOSEPH MOYSON,
JAMES PETRUZELLA,

BY Urban H. Faubion
THEIR ATTORNEY.

INVENTORS:
JOSEPH MOYSON,
JAMES PETRUZELLA,

BY [signature]
THEIR ATTORNEY.

3,331,000

GATE TURN OFF SEMICONDUCTOR SWITCH HAVING A COMPOSITE GATE REGION WITH DIFFERENT IMPURITY CONCENTRATIONS

Joseph Moyson, Union Springs, and James Petruzella, Auburn, N.Y., assignors to General Electric Company, a corporation of New York Filed Oct. 18, 1963, Ser. No. 317,323
5 Claims. (Cl. 317—235)

ABSTRACT OF THE DISCLOSURE

A PNPN gate turn off switch is provided wherein the turn off gain is enhanced by providing a composite gate region. The material in the gate region immediately under the adjacent emitter junctions has a uniform low resistivity to reduce lateral voltage drop under the emitter junctions and enhance both turn on and turn off gain and the next adjacent region under the low resistivity region is of a higher resistivity material in order to provide the desired device blocking voltage.

This invention relates to semiconductor switches of the type which can be switched between two states of impedance, i.e., between a high impedance and a low impedance. In particular, the invention relates to such switches which can be changed from a state of low impedance to a state of high impedance and from a state of high impedance to a state of low impedance. Stated in another way, the invention relates to such semiconductor switches which can be changed from a highly conductive state to a much less conductive state (turned off) and also switched from the essentially non-conductive state to the highly conductive state (turned on). The invention is concerned with a semiconductor switching device of the four layer PNPN or NPNP type which has become known as a semiconductor gate turn-off switch (called a GTO).

Semiconductor switches have become an important component in a wide variety of control applications, particularly PNPN three terminal devices of the type frequently referred to as silicon controlled rectifiers. Operation of such devices is described in Chapter 1 of the General Electric Controlled Rectifier Manual, second edition, copyright 1961 by the General Electric Company, the article by Moll, Tanenbaum, Goldey and Holonyak in Proceedings of the IRE, September 1956, volume 44, pages 1174 to 1182, and in the copending patent application, Ser. No. 838,504, entitled, Semiconductor Devices and Methods of Making Same, filed Sept. 8, 1959, in the name of Nick Holonyak, Jr., and Richard W. Aldrich and assigned to the assignee of the present application. The semiconductor switch is made an active element in the circuit by connecting two of its three terminals (its anode and cathode terminals) in the circuit to be controlled. With the switch in its "off" condition the rectifier acts as a high impedance element. Except for a very small leakage current, the switch acts as an open circuit. When the switch is in its "on" condition, it presents a very low impedance device (essentially a short circuit).

The usual mechanism for rendering the PNPN switches conductive is to introduce current into a third lead or terminal (called the gate lead) which increases the current flowing through the device and thereby renders the device conductive. This action is descriptively referred to as triggering the device or turning it on. When the device is triggered into the high conduction mode, the gate lead has very little control over the device and the only method of turning the device off is to reduce the current between the device anode and cathode (the main conduction path) below a given level called the holding current level.

These PNPN switch devices have been made extremely sensitive to triggering (turn on) injection current at the gate terminal. That is, they have been made so that an extremely small gate injection current can be used to change the device from its high impedance state to its high conduction mode. However, it has been extremely difficult to switch the device from its high conduction mode to the low conduction mode of operation utilizing current removal at the gate lead. A number of approaches to making the devices more sensitive to being turned off by gate current removal have been quite successful. For example, see the copending patent applications entitled Semiconductor Switch, Ser. No. 210,364, filed July 17, 1962, in the name of Nick Holonyak, Jr., and Richard W. Aldrich and Ser. No. 285,385 filed June 4, 1963, in the name of present inventors and both assigned to the assignee of the present invention. The use of these inventions produce GTO's with high sensitivity to turn-off signals or pulses. However, most such devices have a serious limitation on the level of device current that can be turned off by means of a gate pulse. The present invention contemplates using the teachings of the aforementioned inventions to produce GTO's with high sensitivity to turn-off signals and the teachings of the present invention to allow an increase in the level of device current which can be turned off using a gate pulse or signal.

In order to make the present description complete and self sufficient, the gate turn off mechanism is discussed as well as the means of raising the level of device current that can be turned off with a gate pulse. In other words, both the means of increasing the GTO sensitivity to a turn off signal at the gate and the means of increasing the level of device current which can be turned off is discussed.

To understand the gate turn off mechanism of the four layer PNPN switch it is necessary to understand a few of the operating principles and characteristics of 4 layer, 3 terminal switching elements. The operation of these devices is generally well understood. However, certain aspects of the operation of these devices is so crucial to an understanding of the present invention that a somewhat simplified physical description of the operation is given here.

The heart of the four layer switch is generally a pellet of monocrystalline semiconductor material such as silicon which has four layers of alternate conductivity type, i.e., 4 layers which alternately have an excess of positive holes (P type material) and an excess of negative electrons (N type material) with a barrier or junction between the layers. Thus, the device is called a PNPN or NPNP semiconductor device to describe the four layers of alternate conduction types. The switch (GTO or SCR) has a pair of main terminals each connected to one outer layer of the four layers and a gating terminal connected to one intermediate layer.

One of the easiest ways to understand the operating principles is to consider a 4 layer PNPN device (see FIGURE 1A) to consist of a PNP and an NPN transistor (FIGURES 1B and 1C respectively) with the center junction $J_C$ and the two center layers common to both transistors. The main current carrying terminals are connected to outer layers of the four layer device, therefore, each conceptual transistor has one of the main contacts connected to one outer layer. The four layer device has a gating terminal (gate lead $I_G$) connected to one of its internal layers, thus one of the conceptual transistors (PNP) has the gating terminal connected to its outer layer which is opposite the outer layer to which the main terminal is connected and the other conceptual transistor (NPN) has the gating terminal connected to its internal or base layer.

It is generally recognized that a semiconductor device consisting of two layers of different conductivity types (i.e., a PN device) readily conducts current in one direction but blocks current in the opposite direction. For example, if a voltage is applied across such a PN device which is positive at the P type layer and negative at the N type layer, the device readily conducts current whereas the device blocks current flow when the reverse voltage is applied. Simply stated, the reason the device readily conducts when a voltage is applied across it which is positive at the P type layer is that the positive voltage repels P type carriers at one end of the device and the negative voltage repels the negative electrons at the other end. Thus, the P and N type conduction carriers are moved toward and across the junction. With the opposite polarity applied, i.e., the junction reverse biased, the holes and electrons are attracted away from the junction. This forms a depletion region at the junction which is relatively free of both P and N type carriers. A charge appears across the depletion region (and junction), much as in a common capacitor, which opposes current flow. This condition can be broken down and current forced through the device by raising the reverse voltage to a sufficiently high value.

Now consider the PNPN device with a positive potential at the P type end layer and a negative potential at the N type end layer in the light of this discussion. It is seen that the junctions between the two outer end layers (at both ends) tend to conduct whereas the center junction, $J_C$, between the N and P type layers tends to block current flow through the device. In other words, each of our two conceptual transistors which make up the PNPN device has one junction which tends to block current flow through the device. Like the PN device discussed above, the PNPN device can be made to conduct by raising the voltage across it to some high value which forces conduction across the center junction $J_C$. It may also be made to conduct by introducing the proper amount of current through a gate lead on one of the intermediate layers to cause a change of the charge condition across the center junction $J_C$.

The total current flowing in the PNPN structure can be pictured as the sum of currents flowing in each of the individual conceptual transistor sections. Current flow in each section depends upon having current supplied to its base by the other section. That is to say that conduction of the PNP section depends on electron current from the end N type layer to the internal N type layer (base of the PNP transistor) and conduction of the NPN section depends upon flow of hole current from the end P layer to the internal P type layer (base of the NPN transistor). Without these currents the proper charge cannot be maintained across the center junction $J_C$ to support current flow.

Conditions for the device to be conducting can be stated in terms of the current gain of the individual sections. In fact, the concept of current gain $\alpha$ in each of the transistor sections (i.e., in each part of the total PNPN structure) is so fundamental to an understanding of turn off gain that a digression is made here to explain this concept. The current gain $\alpha$ is defined as the fraction of current injected at the emitter of each of the transistors which reaches the collector of that transistor. In other words, in the conceptual PNP transistor the current gain $\alpha_{pnp}$ defines the fraction of the current through the emitter (the end P type layer which has the positive voltage applied to it) which reaches the collector (i.e., the internal P type layer which is negatively biased). Thus $\alpha_{pnp}$ is defined by the ratio of the collector current to the emitter current and in this particular transistor section the predominant current flow is hole current. The current gain of the NPN conceptual transistor section, $\alpha_{npn}$ defines the fraction of current through the emitter (the end N type layer which is biased negatively) that reaches the collector (the internal N type region which is positively biased).

The total current of the device at the center junction $J_C$ is composed of the hole current from the end P region, the electron current from the end N region and a small leakage or thermally generated current. It is known that the device is highly conductive (on) when the sum of the current gains ($\alpha$'s) of the two transistor sections is unity and off or nonconductive when the sum of the current gains in the two transistor sections is less than unity e.g., 0.9. The current gains ($\alpha_{pnp}$ and $\alpha_{npn}$) increase as the collector to emitter voltage is increased but only slightly until the device (the normally blocking junction $J_C$) breaks down and then appreciable current flows. The current gain then increases rapidly as the emitter current is increased.

The gate lead which may be connected to the internal P type conduction layer provides a very effective way of increasing the emitter current. That is to say that the emitter current is easily increased through transistor action by introducing current, $I_G$, at the gate lead. The mechanism for switching the device from its state of high impedance to its state of low impedance is well understood. As indicated above, it is also understood that the device may be switched from its on condition (its low impedance condition) by decreasing the current supplied to the base of either transistor section to such a low value that the center junction $J_C$ again becomes a blocking junction, i.e., unsaturated or reverse biased. This may be done by decreasing the voltage across the device until it can no longer support the necessary current flow.

Another mechanism for doing this is to extract current at the gate lead. This "drains" positive carriers from the internal P type base region and reduces the voltage across the emitter junction which in turn reduces the flow of negative carriers from the N type end region and effectively "starves" the junction $J_C$. The reduced flow of electrons across the junction $J_C$ into the internal N type region results in a reduced voltage across the junction which also reduces the flow of positive holes from the end P type emitter region. If the withdrawn gate current is large enough, the center junction $J_C$ returns to its normally blocking condition. This effect takes place in a very short time, e.g., a few microseconds. This latter mode of operation is not used in most PNPN semiconductor switches because the current which must be withdrawn in order to turn the device off approaches the normal conduction current of the device.

For an understanding of the way a practical gate turn off switch is built, reference is again made to the conceptual pair of transistors illustrated in FIGURES 1, 1B and 1C. Assume that the gate lead is connected to the central P type layer (base layer) of the NPN transistor (FIGURE 1C) and consider the situation when the device is conducting. A portion of the current through the device is supplied by the PNP transistor and the magnitude of this current is dependent upon its gain $\alpha_{pnp}$. If the PNP transistor section of the device supplies a current which is much greater than the current required to keep the "normally blocking center junction $J_C$" from becoming nonconductive, then it becomes very difficult to remove enough current at the gate lead to turn the device off. Actually, under these conditions the current withdrawn by the gate may not reach a sufficiently high value to turn the device off until it almost equals the device current itself. This suggests that the current gain of the PNP region should be reduced to the point that it supplies little if any more than just that current required to keep the center junction $J_C$ conductive when no gate current is flowing. This current limit requirement is met if the current gain of the device is made to approach zero.

It is well understood that the requirement for a device to turn on is that the sum of the current gains ($\alpha_{pnp}+\alpha_{npn}$) of the conceptual transistors approach unity. Thus, if the current gain of the PNP section of the device approaches zero then the current gain of the NPN section of the device should approach unity. A device which can readily be turned off results when the ratio of the current gain of the NPN transistor section to the current gain of the PNP section is about an order of magnitude or more.

A parameter often used to express the ease with which such devices can be turned off is called "turn off gain." "Turn off gain" may be defined as the ratio of current flowing in the load when the switch is on to the gate current required to turn the switch off. In one particular device, a load current of 600 milliamperes is turned off with an 8 milliampere gate current to provide a turn off gain of 75.

Pursuing this line of reasoning described above has led workers skilled in the art to suppress the current gain of one of the conceptual transistors ($\alpha_{pnp}$ in the illustrated device) in order to enhance the turn off gain. There are a number of ways to achieve this result but one of the best ways to restrict current gain of a three layer device is to limit the efficiency of one of the device emitters. Even with a high turn off gain, however, there may be a serious limitation on the magnitude of device current that can be turned off by means of a current pulse at the gate.

Such limitation is, in most practical devices, a result of a high lateral resistance in the device layer to which the gate lead is connected (called the gate layer here) and, particularly, in the area immediately under the emitter junction. This effect may be in many practical devices accentuated by providing a device structure which causes portions of the emitter junction in question to be unduly remote from a gate lead. The high resistance in this region (the gate layer) has at least two detrimental effects which are, in a way, related. The first is that the high resistance causes a voltage drop in the gate layer under (laterally) the emitter junction when turn off current flows which tends to prevent all of the emitter junction from being returned to its blocking state and the second is that with high turn off current flowing in the high resistance region sufficient heat is generated to destroy the gate lead or connection. To the first point, if any part of the emitter junction is not returned to its current blocking state, the total device current is "crowded" through that portion of the junction (the conductive region). With the resultant high current densities, the device becomes harder to turn off with gate current.

Conversely, when resistivity of the material in the gate layer immediately adjacent the emitter junction is low, the lateral voltage drop under the junction is small and the entire junction can be readily biased off with gate current. In devices which have a diffused gate layer, the resistivity is low (high level of dopant) at the layer surface and increases exponentially (dopant decreases exponentially) toward the next junction. Thus, the sensitivity is low at the surface and higher under the emitter junction.

The present invention alleviates these problems by providing relatively low resistivity material under the appropriate emitter junction and in a preferred embodiment provdes a uniform resistivity throughout the gate layer by epitaxially depositing this layer.

In carrying out the present invention a four layer GTO is provided which has a low resistivity (preferably uniform) non-degenerate gate layer in order to increase the level of total device current which can be turned off by a gate signal. In a preferred embodiment, the device is so structured as to reduce the distance between all parts of the emitter junction or junctions adjacent the gate layer and a gate lead or leads.

The features which are believed to be characteristic of the invention are set forth with particularity in the appended claims. The invention itself, however, both as to its organization and advantages thereof may best be understood by reference to the following description taken in connection with the accompanying drawings in which:

Figure 2:
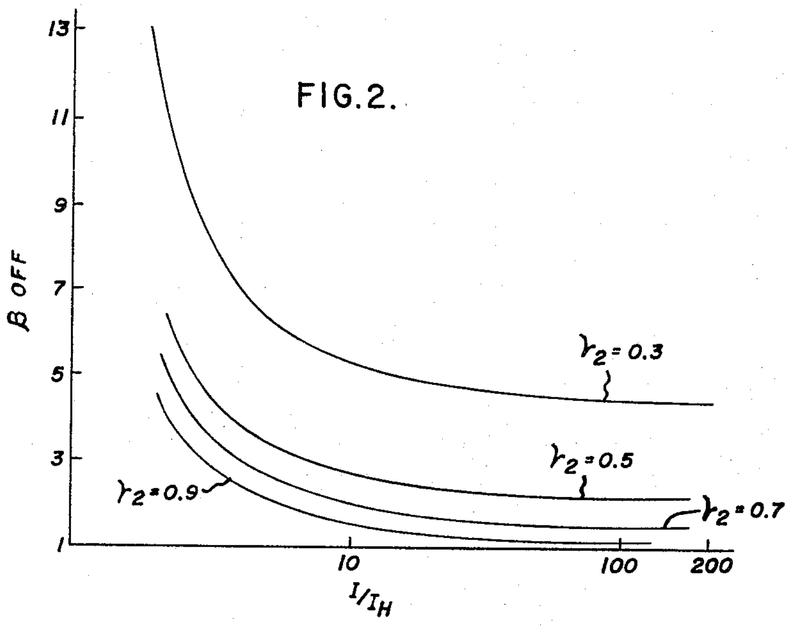
Figure 3:
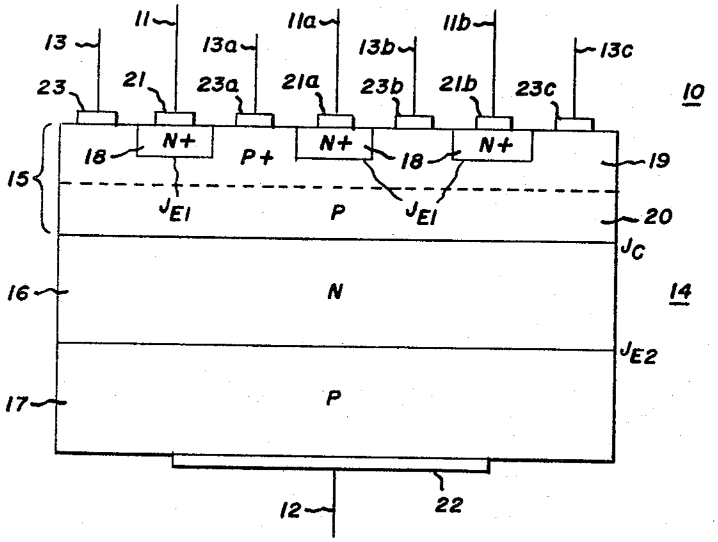
Figure 4:
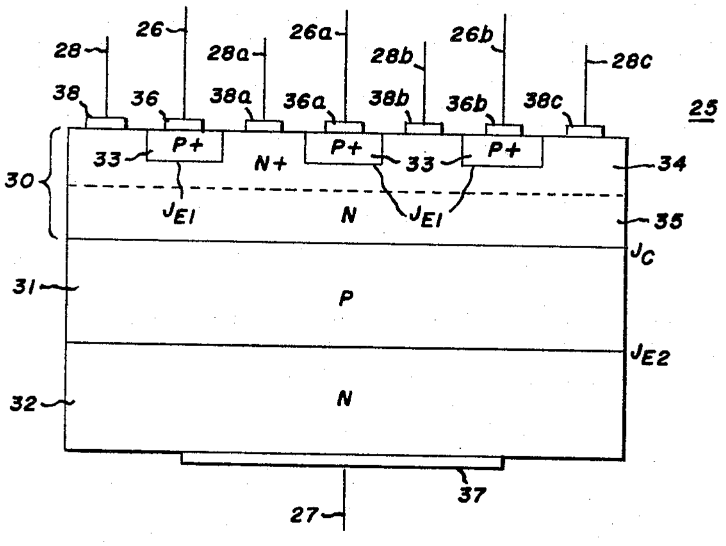

FIGURE 2 is a graph showing calculated values of turn off capability $\beta_{off}$ plotted along the axis of ordinates against the ratio of device current I to hold current $I_H$ plotted along the axis of abscissas for a number of values of emitter injection efficiency $\gamma_{E2}$, and FIGURES 3 and 4 illustrate diagrammatically embodiments of three terminal semiconductor switches composed of four layer semiconductor pellets and each constructed in accordance with teachings of the present invention.

Figures 1A, 1B, 1C:
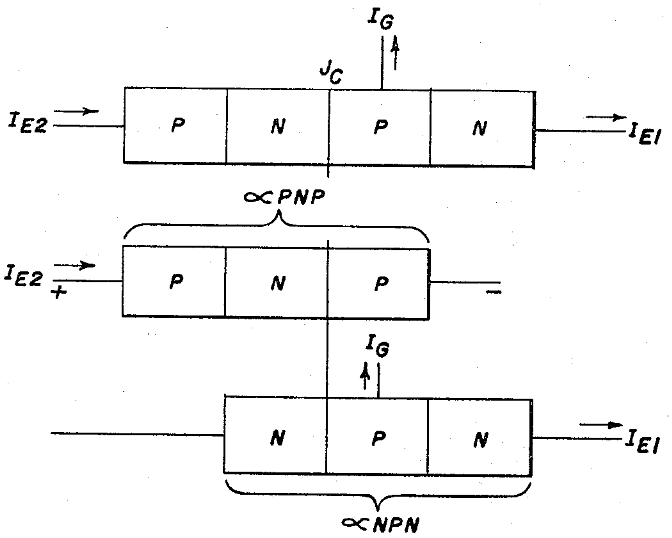
FIGURE 1A is a schematic representation of a four layer, three terminal PNPN switch used in the description and analysis of the present invention (including the above description)
FIGURES 1B and 1C are conceptual PNP and NPN transistors constructed from the four layer device of FIGURE 1A which are analyzed individually and superimposed in the above explanation of the concepts of the four layer switch used in the present invention.

In order to obtain a better understanding of four layer switches, their turn on and turn off mechanisms and, consequently, the invention, a simple one dimensional analysis is given utilizing the typical four region PNPN structure schematically represented in FIGURE 1A. Before beginning the analysis, however, it should be recognized that a three terminal PNPN switch cannot be described accurately by a one dimensional model, except at very low current levels. Even so, the analysis provides considerable insight into the problems involved in both turning on and turning off such switches.

As pointed out above, the four zone, three terminal PNPN switch illustrated in FIGURE 1A has contacts fixed to the two end regions and a gate lead attached to one of the base layers (the internal P region as illustrated). Assume an external voltage applied across the switch which is positive at the end P region and negative at the end N region. For this polarity the current flows through the device as indicated by the arrows from the external P type region to the external N type region. The current flowing into the external P type region is designated as $I_{E2}$, the current flowing out from the external N type region is designated as $I_{E1}$ and the current flowing in the gate lead is designated as $I_G$. As above, the current gain for the PNP region is designated as $\alpha_{pnp}$ and the current gain for the NPN region is designated as $\alpha_{npn}$. If some leakage currents are neglected, the following equations can be written to describe the currents in the turned on device:

(1) $$I_{E2}\alpha_{pnp}-I_G=(1-\alpha_{npn})I_{E1}$$

(2) $$I_{E1}\alpha_{npn}=(1=\alpha_{pnp})I_{E2}$$

solving for $I_{E2}$ the following equation is obtained:

(3) $$I_{E2}=I_G\frac{\alpha_{npn}}{\alpha_{npn}+\alpha_{pnp}-1}$$

To determine the requirements for turning off the device, the device is considered to be in the conductive state with an external current to the load flowing which is determined principally by the magnitude of the external power supply voltage and the resistance of the load connected to the device. As was indicated previously, the center junction in the device, i.e., the junction between the internal N and P regions (labeled $J_C$) is a junction which normally opposes current flow in the direction indicated. When current is flowing, a voltage appears across the junction $J_C$ which is in a direction to maintain or sustain current flow through the junction. In other words, the junction voltage changes from its blocking direction in the non-conduction state to "forward bias" in its conducting state. Thus, it is apparent that the voltage across this junction varies. By this mechanism, the current in the device and the current gains ($\alpha$'s) of the two sections of the device change. Once the device is conducting, the change of the $\alpha$'s is in a direction to supply exactly enough base current for each transistor section to maintain the current flow. If the current is removed from one of the bases the load current drops unless the current gains ($\alpha$'s) can readjust (increase) themselves.

For a given load current there is a maximum value possible for each of the $\alpha$'s. As the outflow of gate current is increased, the $\alpha$ of the NPN section (the section having the gate lead attached to its base) decreases until $(\alpha_{npn}+\alpha_{pnp})$ is less than one. At this point, the device switches to the off state.

To find the gate current $I_G$ required to turn off a given load current, $I_{E2}$, the $\alpha$'s are assumed to have their maximum values (for the currents $I_{E2}$ and $I_{E1}$). We assume that $I_{E2}$ has a minimum possible value $I_M$ with the gate current $I_G$, and $I_H$ is the holding current necessary to maintain the device in its on condition where $I_G=0$. We define turn off capability $\beta_{off}$ as a ratio of change in minimum hold current to the gate current $I_E$. This parameter is sometimes called turn off gain but, as previously indicated, for the present discussion turn off gain is defined as the ratio of load current to the gate current required to turn it off. The turn off capability parameter is considered important since it expresses the change in holding current $I_H$ at different levels of load current. The following equation defines turn off capability for the device:

$$\beta_{off}=\frac{I_M-I_H}{I_G}=\frac{I_M}{I_G}\left(I-\frac{I_H}{I_M}\right) \quad (4)$$

Then substituting from Equation 3 above turn off capability $$\beta_{off}=\left(\frac{\alpha_{npn}}{\alpha_{npn}+\alpha_{pnp}-1}\right)\left(1-\frac{I_H}{I_M}\right) \quad (5)$$

or if $I_M$ is much larger than $I_H$ $$\beta_{off}=\frac{\alpha_{npn}}{\alpha_{npn}+\alpha_{pnp}-1}(I_M>>I_H) \quad (6)$$

It turns out that this is precisely the expression which can be arrived at for turn off gain when starting with the definition given above. This, of course, is to be expected since the turn off gain definition initially ignores holding current $I_H$ and this expression is arrived at assuming the holding current term $$\left(\frac{I_H}{I_M}\right)$$

is negligible.

In general, the way that the $\alpha$'s vary as a function of current is unknown. Experiments indicate that it is possible to have both $\alpha$'s approach unity at moderate currents (as, for example, a result of fields developed by ohmic current flow). Under these conditions, the turn off gain then also approaches unity. It is clear then that the turn off gain can be high if some means can be found to restrict one or both of the $\alpha$'s. For the expression above (Equation 6) it is clear that the better turn off gain is achieved if the $\alpha_{pnp}$ is restricted.

An inspection of the equation for the turn off gain (6) shows that the individual current gains $\alpha_{npn}$ and $\alpha_{pnp}$ should have a sum very nearly unity for maximum turn off gain and that the turn off gain can be high if a means is found to restrict one or both of the individual current gains ($\alpha$'s). Since the $\alpha_{npn}$ appears in the numerator (for the device structure illustrated) it becomes apparent that maximum effect will be obtained if $\alpha_{pnp}$ is the one which is suppressed. A consideration of these equations also shows that in order for a PNPN or NPNP device to exhibit a switching characteristic (from high to low impedance) the current gain ($\alpha$) of at least one section of the device must increase with current. That is to say, that since the sum of the $\alpha$'s of the section must be greater than one to exhibit turn on gain and since the sum of the $\alpha$'s must be less than unity in order to have turn off gain it is apparent that at least one component transistor structure must have an $\alpha$ which varies with current if both turn on and turn off gain are to be exhibited.

One approach to enhance the turn off gain of the device which follows is to suppress the one current gain ($\alpha_{pnp}$) so that its maximum value is near zero (e.g. 0.1 or less) and adjust the other current gain so that it rapidly increases with load current to a value as near unity as possible. It is recognized that the current gain $\alpha$ of a four layer PNPN switch is basically composed of two parameters viz: $\alpha$ the emitter efficiency and T, the transport factor, $\alpha$ is simply the product of these two quantities, that is $$\alpha=\gamma_T \quad (7)$$

Now $\gamma$ is principally determined by the relative impurity concentration of the layers on opposite sides of the junction considered and for not too high or too low injection levels is given by the following equation:

$$\gamma=\frac{1}{1+\frac{\sigma_B W_B}{\sigma_E L_E}} \quad (8)$$

where $L_E$ is diffusion length for minority carriers on the emitter side of the junction, $W_B$, is the base width, $\sigma_B$ and $\sigma_E$ are conductivities of the base and emitter regions respectively. The emitter width $W_E$ may be substituted for the diffusion length $L_E$ in the case of the present invention since emitter width will normally be less than a diffusion length.

Now consider the means of restricting the current gain $\alpha$. One means of restricting one of the $\alpha$'s, for example, $\alpha_{pnp}$, is to make emitter efficiency $\gamma_{E2}$ of the PNP section low (consider Equation 7). A way to illustrate this effect is shown in FIGURE 2 of the drawings where a calculated value for turn off capability $\beta_{off}$ is plotted along the axis or ordinates as a function of the ratio of device current to holding current, $I/I_H$, (plotted along the axis of abscissas for several values of emitter injection efficiency $\gamma_{E2}$). For this purpose, $\alpha_{npn}$ is assumed constant at 0.9 $\alpha_{pnp}$ is assumed to have the form:

$$\alpha_{pnp}=\gamma_{E2}\exp(-I_O/I) \quad (9)$$

where $I_O$ is the current at which the device turns off. The holding current $I_H$ as obtained for the condition $$\alpha_{npn}+\alpha_{pnp}=1$$

is $$I_H=\frac{I_O}{\frac{\ln \gamma_{E2}}{1-\alpha_{npn}}} \quad (10)$$

so that $$\alpha_{pnp}=\gamma_{E2}\exp\left[-I_H\frac{\ln\left(\frac{E_2}{1-\alpha_{npn}}\right)}{1}\right] \quad (11)$$

Notice that the form for $\alpha_{pnp}$ is assumed. This assumption is not necessarily generally accepted but it is generally accepted that the $\alpha$ varies roughly exponentially with emitter current. The curves illustrate that for high values of injection efficiency, $\gamma$, the turn off gains are low. Further, the turn off gain for a given injection efficiency decreases as the current increases but levels off at some substantially minimum value for each emitter injection efficiency.

Now to the point of reducing the current gain. From Equations 7 and 8 respectively, it is seen that the current gain is directly proportional to emitter efficiency $\gamma$ and the emitter efficiency is a function of the conductivity of both the base $\sigma_B$ and the emitter $\sigma_E$. The emitter efficiency decreases as the ratio of the base to emitter conductivity increases, and as has been previously pointed out, turn off gain increases as emitter efficiency decreases.

The present invention contemplates use of any of the means to enhance turn off gain such as means taught in copending applications on Semiconductor Switches assigned to the assignee of the present invention. For example, use of teachings of the Nick Holonyak, Jr. and Richard W. Aldrich application, Ser. No. 838,504 supra; Joseph Moyson and James Petruzella application Ser. No. 285,385 filed June 4, 1963; and the applications of Finis E. Gentry, Ser. No. 306,147 and 312,385 filed Sept. 3, 1963, and Sept. 30, 1963, respectively may be used in conjunction with the present invention. The present invention, however, eliminates or materially alleviates additional problems to which the above referenced applications do not direct themselves. Viz, the problems which result from high lateral voltage drop and high power loss in the gate layer, particularly immediately under the adjacent emitter junction.

Semiconductor switching devices (GTO's) 10 and 25 constructed in accordance with the principles of the present invention are illustrated in FIGURES 3 and 4 respectively. The GTO 10 as illustrated in FIGURE 3 is provided with three sets of leads and terminals 11 through 11*b* inclusive, 12 and 13 through 13C inclusive which are intended to be connected in the circuit in which the GTO is employed. The main terminals 11–11*b* and 12 are connected in a main current carrying path of the circuit where the GTO is used in such a way that the cathode terminals 11–11*b* are connected together and are negative relative to the anode terminal 12. The gating terminals 13–13C are connected to a source which supplies a positive (relative to cathode) turn-on signal when the current path between the main terminals 11–11*b* and 12 is to be rendered highly conductive (turned on) and a negative (relative to cathode) turn off signal when the internal current path between the main terminals 11–11*b* and 12 is to be rendered high impedance (turned off).

As illustrated in FIGURE 3, GTO 10 includes a single monocrystalline semiconductor pellet 14 which is composed of four layers of opposite conductivity type. The pellet 14 includes internal P and N type layers 15 and 16 respectively, which extend across the entire pellet and from the center or collector junction $J_C$ between them, a lower P type layer 17 adjacent internal N type layer 16 which extends across the entire pellet 14 and an external N type layer 18 at the upper surface of pellet 14 which, as illustrated, is made up of three like parts each formed in the internal P type layer 15. As illustrated, the three parts of upper emitter layer 18 are positioned so that one part is in the center of the upper surface of pellet 14 and the other two parts are equally spaced on opposite sides of it. Further, the outer parts are equally spaced from the pellet edge. This arrangement is particularly attractive for gate to emitter junction spacing as will be discussed later.

The boundaries between each part of the upper N type external layer 18 and internal P type layer 15 defines upper emitter junction $J_{E1}$ and the boundary between lower P type external layer 17 and internal N type base layer 15 defines the lower emitter junction $J_{E2}$. In order to provide the desired device characteristics the internal P type layer 15 is composed of two layer like regions 19 and 20. The upper region 19 is of a relatively low resistivity P type material and is contiguous with upper emitter junctions $J_{E1}$. Since this region is low resistivity (highly doped) it is designated at P+. The lower region 20 of P type layer 15 is composed of a relatively high resistivity P type material and is contiguous with center junction $J_C$. The resistivity (inverse of conductivity) of the upper region 19 of the P type base layer 15 is selected so as to provide the desired low resistivity material under the upper emitter junctions $J_{E1}$ and hence the desired low lateral resistance in the gate layer 15. At the same time, care is taken not to have a degenerate region 19 adjacent the upper emitter junctions $J_{E1}$. In other words, care is taken to prevent these junctions from being tunnel junctions. The higher resistivity lower region 20 is provided to obtain the desired device blocking voltage.

The boundary between the two regions 19 and 20 of layer 15 can be referred to as a juncture rather than a junction. Here the term juncture is used to describe a marked transition or boundary between regions of different conductivity whereas a junction is used to describe the boundary between materials of different conductivity type.

In order to provide a means for connecting the appropriate layers of pellet 14 in the circuit to perform the function of a GTO, ohmic contacts 21 through 21*b*, 22 and 23 through 23*c* are provided. Ohmic contacts 21–21*b* are provided on parts of the upper N type layer 18 and provides an electrical connection for each of the device cathode leads 11–11*b*. On the bottom surface of pellet 14, an ohmic contact 22 is provided on the lower P type layer 17. This ohmic contact is connected directly to the anode lead 12. Ohmic contacts 23 through 23*c* inclusive are provided on the upper surface of internal P type layer 15. These contacts 23–23*c* are connected directly to the gate leads 13 through 13*c* respectively.

As illustrated, the gate contacts 23–23*c* are positioned so that a pair of contacts are on each side of each of the three parts of emitter layer 18 and further, the part of each emitter junction $J_{E1}$ which is farthest away from a gate contact is equidistant from two such contacts. This means that the most remote part of any upper emitter junction $J_{E1}$ is no more remote from a gate contact than any other part of any emitter junction $J_{E1}$. Thus, no single emitter junction is likely to have a part which is more difficult to turn off by gate current than the other emitter junctions.

One method of forming a practical device of the type illustrated in FIGURE 3 is to start with a silicon pellet a little over 7 mils thick and of N conductivity type with a resistivity of around 20 ohm-centimeters (impurity concentration of about $2.7 \times 10^{14}$ atoms per cc.). This material ultimately forms the internal N type layer 16. The pellet 14 is gallium or boron diffused to a depth of about 1.3 mils so that P type conductivity layers are formed on both sides of the N type material with a surface concentration of approximately $10^{18}$ atoms per cc. The P type layer on one side forms the lower region 20 internal P type gate layer 15 and the P type layer on the other side forms the lower P type layer 17. After this diffusion, one layer of P type material is lapped or etched to leave a three layer PNP pellet with one P type layer 0.3 to 0.5 mil thick. This thin layer is retained as the lower region 20 of the upper P type layer 15 and is of high enough resistivity to provide the desired device blocking voltage. Next, the upper P+ type region 19 of layer 15 is epitaxially deposited to a thickness of about 1 mil. This material, being epitaxially deposited, has a uniform impurity concentration of about $1\text{–}5 \times 10^{18}$ atoms per cc. which provides a material of uniform resistivity of .02–.06 ohm-cm. The pellet is masked by conventional masking techniques and phosphorous diffused at the upper surface to a depth of about 0.7 mil to form the upper N type emitter layer 18 and hence, the upper emitter junction $J_{E1}$ of the configuration illustrated in FIGURE 3 over a low and uniform resistivity region 20 of gate layer 15. This diffusion provides a surface concentration of approximately $10^{21}$ atoms per cc.

FIGURE 4 illustrates that the invention applies equally well to the exact dual of the device illustrated in FIGURE 3. That is to say, that the invention applies equally well where P type layers are directly substituted for N type layers and vice versa in the device of FIGURE 3.

In the device 25 of FIGURE 4 the monocrystalline semi-conductor pellet has four layers of PNPN conductivity types respectively. The upper P type layer 33 forms the upper emitter layer and the like its dual (layer 18 in FIGURE 3) it is formed in three parts. This layer 33 is formed in the next adjacent internal N type layer 30, the junction $J_{E1}$ is formed between these two layers. The internal N type layer 30 is composed of two regions. An upper low (and preferably uniform) resistivity region 34 in which emitter junctions $J_{E1}$ are formed, and a lower region 35 which has a higher resistivity. The internal N type layer 30 is immediately adjacent internal P type layer 31 and the device center junction $J_C$ is defined at the boundary between these two layers. The lower N type emitter layer 32 is adjacent the P type layer 36 and the lower emitter junction $J_{E2}$ is defined at the boundary between the two layers.

The switch 25 of FIGURE 4 is also provided with three sets of leads or terminals; viz., anode leads 26 through **26*b* inclusive, cathode lead 27 and gate leads 28 through 28*c* inclusive. The device main leads (anode leads 26 through 26*b* and cathode lead 27) are connected in a main current path in such a manner that the anode 26–26*b* is positive relative to the cathode 27. The gating terminals 28–28*c* are connected to a source which supplies a turn on signal when the current path between main terminals 26–26*c* and 27** is to be rendered highly conductive (turned on) and a turn off signal when the internal current path between main terminals is to be rendered high impedance (turned off).

In order to provide a connection for the anode leads 26 through **26*b*, ohmic contacts 36 through 36*b* respectively are formed on the parts of upper P type emitter layer 33. The connections for the gate leads 28 through 28*c* are provided by ohmic contacts 38 through 38*c* formed on the upper surface of internal N type base region or gate layer 30. The lower surface of the device is provided an ohmic contact 27 on the lower N type emitter layer 32 which provides a means for connecting the cathode lead 27** to the device.

The low resistivity and high resistivity N type regions 34 and 35 respectively of the internal N type base or gate layer 30 perform the same functions in essentially the same way as do their duals in the device of FIGURE 3. Consequently, it is believed that further discussion of the function of these parts and the operation of the device is not warranted or necessary. However, it should be noted that the dimensions of the corresponding (dual) layers and relative impurity concentrations of these layers should be the same for both devices.

For example, the upper P type emitter layer 33 of the device of FIGURE 4 should be approximately 0.7 mil thick and have a surface impurity concentration of approximately $10^{20}$ atoms per cc. as does its dual layer (upper N type emitter layer 18) of the device of FIGURE 3. Thus, internal N type gate layer 30 of the device of FIGURE 4 should have a thickness between upper emitter junction $J_{E1}$ and the center junction $J_C$ of between 0.6 and 0.8 mil. The internal N type high resistivity region 35 of the internal N type base or gate layer 30 may be between 0.3 and 0.5 mil thick and have an average impurity concentration of approximately $10^{16}$ atoms per cc. and the low resistivity region 34 of the layer may have a thickness of about 1 mil with an impurity concentration of $1\text{–}5 \times 10^{18}$ atoms per cc. The internal P type base layer 31 should have a thickness of about 4.5 mils and an impurity concentration of $2.7 \times 10^{14}$ atoms per cc. The lower N type emitter layer 32 is approximately 1.3 mils in thickness and has a surface impurity concentration of about $10^{18}$ atoms per cc.

While particular embodiments of the invention have been shown, it will, of course, be understood that the invention is not limited thereto since many modifications in the arrangements and instrumentalities employed may be made. It is contemplated that the appended claims may cover any such modifications as fall within the true spirit and scope of the invention.

What we claim as new and desire to secure by Letters Patent of the United States is:

1. A semiconductor switching device adapted to be connected in a main current conducting path and switched between high and low impedance modes including in combination:

(A) three terminal means including
- (a) main terminal means adapted to be connected in a main current carrying path comprising
  - (1) anode terminal means and
  - (2) cathode terminal means
- (b) gating terminal means for selectively switching the semiconductor switching device between its high and low impedance states and between its low and high impedance states, (B) monocrystalline semiconductor pellet including
- (a) four layers of opposite conductive type arranged in succession thereby defining first, second, third, and fourth layers successively with said first and fourth layers forming external layers and said second and third layers comprising internal layers
  - (1) contiguous layers being of opposite conductivity type thereby defining three internal PN junctions
  - (2) said second layer comprising a composite layer including two layer-like regions of like conductivity type and high and low resistivity material respectively thereby defining an internal juncture in said layer
    - (i) said low resistivity region has a substantially uniform resistivity throughout, is non-degenerate and contiguous with said first layer (the next adjacent external layer)

(C) ohmic contact means to said first and fourth layers and each connected to one of said main terminal means so that the four layers are in the main current conducting path of the switching device, (D) ohmic contact means to said low resistivity region of said second layer and connected to said gating terminal means whereby the switching device can be selectively switched between high and low impedance modes in response to signals at said gating terminal.

2. A semiconductor switching device of the type defined in claim 1 wherein said low resistivity region of said second layer is epitaxially deposited.

3. A semiconductor switching device of the type defined in claim 1 wherein said first layer is composed of more than one portion.

4. A semiconductor switching device of the type defined in claim 1 wherein said ohmic contact means to said second layer includes a pair of ohmic contacts on opposite sides of said first layer and disposed such that the geometric center of each of said pair of adjacent ohmic contacts is equidistant from the geometric center of said first layer.

5. A semiconductor switching device of the type defined in claim 1 wherein said first layer is composed of more than one portion and said ohmic contact means to said second layer including a pair of ohmic contacts on opposite sides of each portion of said first layer and disposed such that the geometric center of each portion of said first layer is equidistant from the geometric center of each of said pair of adjacent ohmic contacts.

References Cited

UNITED STATES PATENTS

| | | | |
|---|---|---|---|
| 2,993,154 | 7/1961 | Goldey et al. | 317—235 |
| 3,210,563 | 10/1965 | New | 317—235 X |
| 3,249,831 | 5/1966 | New et al. | 317—235 |
| 3,271,587 | 9/1966 | Schreiner | 317—234 |
| 3,277,352 | 10/1966 | Hubner | 317—234 |

OTHER REFERENCES

"Tune-Off-Gain p-n-p-n Triodes," by J. M. Goldey, I. M. Mackintosh and I. M. Ross, Solid State Electronics, 1961, vol. 3, pp. 119–122.

JOHN W. HUCKERT, *Primary Examiner.*

R. F. POLLISACK, *Assistant Examiner.*